(12) United States Patent
Yang

(10) Patent No.: US 7,413,834 B2
(45) Date of Patent: Aug. 19, 2008

(54) PHOTOMASK WITH ALIGNMENT MARKS FOR THE CURRENT LAYER

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 99 days.

(21) Appl. No.: 11/533,944

(22) Filed: Sep. 21, 2006

(65) Prior Publication Data

US 2008/0076037 A1 Mar. 27, 2008

(51) Int. Cl.
*G03F 9/00* (2006.01)
(52) U.S. Cl. ............................................. 430/5; 430/22
(58) Field of Classification Search ...................... 430/5, 430/22
See application file for complete search history.

(56) References Cited

U.S. PATENT DOCUMENTS 6,974,653 B2 12/2005 Leung et al.

*Primary Examiner*—Christopher G Young
(74) *Attorney, Agent, or Firm*—J.C. Patents

(57) ABSTRACT

A photomask with alignment marks for the current layer is provided with four edges. The photomask includes main patterns, an inter-scribe lane pattern sited between the main patterns, an extra-scribe lane pattern only sited on the three edges of the photomask, a first set of alignment marks for the current layer on opposite edges having the extra-scribe lane patterns. The photomask further includes a second set of alignment marks for the current layer on opposite edges in which only one has the extra-scribe lane pattern, and they are placed on opposite locations in the inter-scribe lane pattern and the extra-scribe lane pattern, respectively. Moreover, each one of the second set of alignment marks for the current layer include multiple parallel patterns and at least one vertical pattern sited on at least one end of the parallel patterns which are parallel to an extended direction of the opposite edges.

7 Claims, 4 Drawing Sheets

PHOTOMASK WITH ALIGNMENT MARKS FOR THE CURRENT LAYER

BACKGROUND OF THE INVENTION

1. Field of the Invention

The present invention relates to a photomask having an alignment mark for the current layer, particularly relates to a mask of ⊓ shape extra-scribe lane which is applicable to be used to improve the mask area used efficiency.

2. Description of Related Art

Under the condition of the higher integration and the smaller size of the process in the semiconductor process they are, the harder and more complicated steps of the process they are. Therefore, it becomes the direction what the manufacturers are trying hard to reach as how to proceed process monitor while using the real-time measuring apparatus in order to react the real-time problem and lower the loss causing by the mistakes made in process.

In general, aside from a proper control of the critical dimension, the yield of a wafer after a photolithographic process also depends on alignment accuracy. Thus, the alignment accuracy of the measurement is an important part in the semiconductor process.

FIG. 1 is a planar view of a photomask with alignment mark for the current layer.

Referring to FIG. 1, wherein a main pattern 102 of a photomask 100 usually includes a device pattern, a line pattern, etc. However, an inter-scribe lane pattern 104 is between the main pattern 102 as well as an extra-scribe lane pattern 106 which is sited on the four edges of the photomask 100. The exposure shot maps are designed and set recipe into the exposure tool such as scanner exposure system or stepper exposure system, the four extra-scribe lanes are over lay to the four nearby shot map specifically. Further, sets of the alignment marks for the current layer 108a and 108b are sited on the extra-scribe lane pattern 106 of the photomask 100 in order to make sure whether the shot maps are well setting at the exposure tool and at the correct location at the wafer. Due to the extra-scribes are over lap, the alignment marks for the current layer 108a and 108a will add to form a pattern shown in FIG. 2 by double exposure.

FIG. 2 is a perspective view of photo resist by using conventional photomask in FIG. 1 to process the exposure and development.

Referring to FIG. 2, after processing the stepping exposure and development of the alignment marks for the current layer 108a and 108b, in which one is a outer square-block and the other one is a inner square-hole in FIG. 1, a frame 200 will be formed just like the outer frame 202 and alignment mark for the current layer 108a formed on the chip scribe-lane as well as the inner frame 204 and alignment mark for the current layer 108b. Therefore, it is applicable to use the microscope apparatus to observe the frame after the stepping exposure and development to determine whether the exposure shot map accuracy is qualified in different steps.

However, under the condition of the higher the integration is in the semiconductor process, the more main pattern shall be expected to be existed in the limited area by the photomask design.

SUMMARY OF THE INVENTION

The present invention is to provide a photomask with alignment mark for the current layer in order to improve the photomask area use efficiency and check the exposure shot map location accuracy.

The present invention is to provide a photomask with alignment mark for the current layer, which can determine whether the exposure shot map accuracy is qualified between the steps of exposure.

The present invention discloses a photomask with alignment mark for the current layer which includes four edges. Such photomask includes a plurality of main patterns, an inter-scribe lane pattern sited between the plurality of main patterns, an extra-scribe lane pattern sited on three edges of the photomask, a first set of alignment marks for the current layer and a second set of alignment marks for the current layer. The first set of alignment marks for the current layer are sited on the opposite edges of the extra-scribe lane pattern. The second set of alignment marks for the current layer are sited on opposite edges in which only one has the extra-scribe lane pattern, and they are placed on opposite locations in the inter-scribe lane pattern and the extra-scribe lane pattern, respectively. Moreover, each alignment mark of the second set of alignment marks for the current layer include a plurality of parallel patterns and at least one vertical pattern sited on at least one end of the plurality of parallel patterns which are parallel to an extended direction of the opposite edges.

According to an embodiment of the present invention, the above-mentioned second set of the alignment marks for the current layer are mirror symmetrical.

According to an embodiment of the present invention, the above-mentioned each of the plurality of parallel patterns in the second set of the alignment marks for the current layer is provided with a width which equals to the distance between the plurality of parallel patterns.

According to an embodiment of the present invention, the above-mentioned second set of the alignment marks for the current layer are sited on the outside of the inter-scribe lane pattern and the outside of the extra-scribe lane pattern at the opposite edges, respectively. The width of each of the plurality of parallel patterns equals to the distance between them. Further, the half of the width equals to the shortest distance between the plurality of parallel patterns and the edge of the photomask.

According to an embodiment of the present invention, the above-mentioned vertical pattern is further sited on the two ends of the plurality of parallel patterns.

According to an embodiment of the present invention, each of the above-mentioned parallel patterns is provided with the identical size.

The invention further provides a photomask with alignment marks for the current layer having four edges. Such photomask includes a plurality of main patterns, an inter-scribe lane pattern sited between the plurality of main patterns, an extra-scribe lane patterns sited on the four edges of the photomask and a plurality of sets of the alignment marks for the current layer sited on the opposite edges of the extra-scribe lane pattern. Every alignment mark of at least one set of the alignment marks for the current layer includes a plurality of parallel patterns parallel with an extended direction of the opposite edges, at least one vertical pattern sited on at least one end of the above-mentioned parallel patterns and a cover pattern which is sited on the area beyond the plurality of parallel patterns and the at least one vertical pattern.

According to another embodiment of the present invention, the above-mentioned set of alignment marks for the current layer including the plurality of parallel patterns, the at least one vertical pattern and the cover pattern are mirror symmetrical.

According to another embodiment of the present invention, each of the plurality of parallel patterns is provided with a width which equals to the distance between the plurality of parallel patterns.

According to another embodiment of the present invention, the above-mentioned cover pattern includes covering a outside area of the extra-scribe lane pattern.

According to another embodiment of the present invention, the above-mentioned cover pattern includes covering a inside area of the inter-scribe lane pattern.

According to another embodiment of the present invention, each of the plurality of parallel pattern has a width, and the width equals to the distance between the plurality of parallel patterns. Further, the half of the width equals to the shortest distance between the plurality of parallel patterns and the cover pattern.

According to another embodiment of the present invention, the above-mentioned vertical pattern includes being sited on the two ends of the plurality of parallel patterns.

According to another embodiment of the present invention, each of the plurality of parallel patterns is provided with the identical size.

The present invention is provided simultaneously with a parallel pattern and a vertical pattern in the alignment mark for the current layer design so as to determine simultaneously the variation of the parallel and vertical movement. When the present invention is applicable to improve the photomask area use efficiency with "⊓ shape extra-scribe lane pattern", the alignment mark for the current layer may be set in the inter-scribe lane pattern in order to determine whether the exposure shot map accuracy is qualified in different steps.

In order to make the aforementioned and other objectives, features and advantages of the present invention comprehensible, preferred embodiments accompanied with figures are described in detail below.

DESCRIPTION OF EMBODIMENTS

To improve the photomask area use efficiency, the photomask of ⊓ shape extra-scribe lane pattern is used in the present application. In other words, one edge of the □ shape extra-scribe lane 106 originally shown in FIG. 1 will be abandoned. Nevertheless, such one of photomask edge will can not have alignment mark check the shot map setting accuracy due to no over lay of this lack of extra-scribe lane on one edge by the conventional alignment mark; thus, it won't be able to determine whether the alignment exposure shot map accuracy is qualified after the stepping exposure and development. Therefore, the present application provides a photomask shown in FIG. 3.

Figure 3:
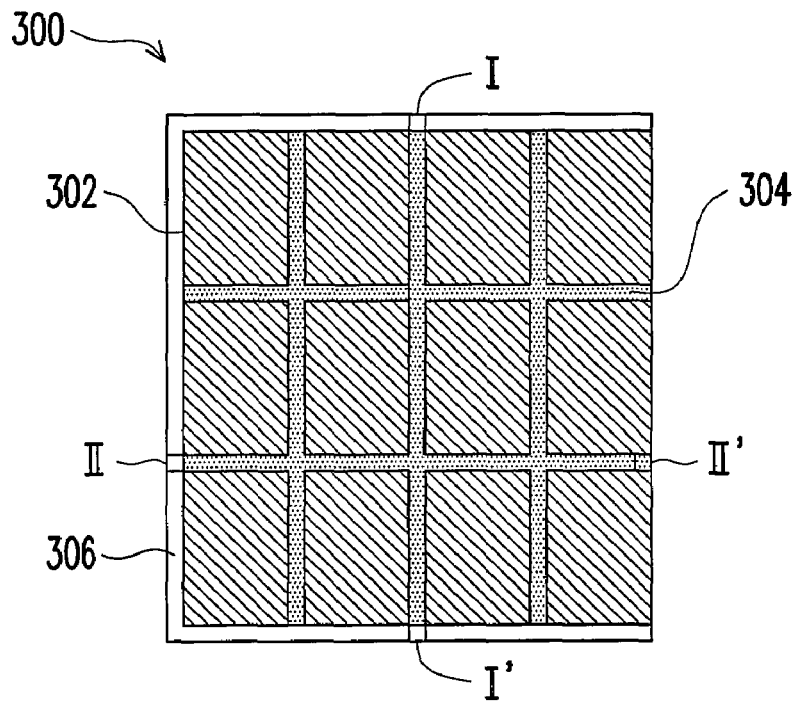
FIG. 3 is a planar view of a photomask according to an embodiment of the present invention.

FIG. 3 is a planar view of a photomask according to an embodiment of the present invention.

Figure 1:
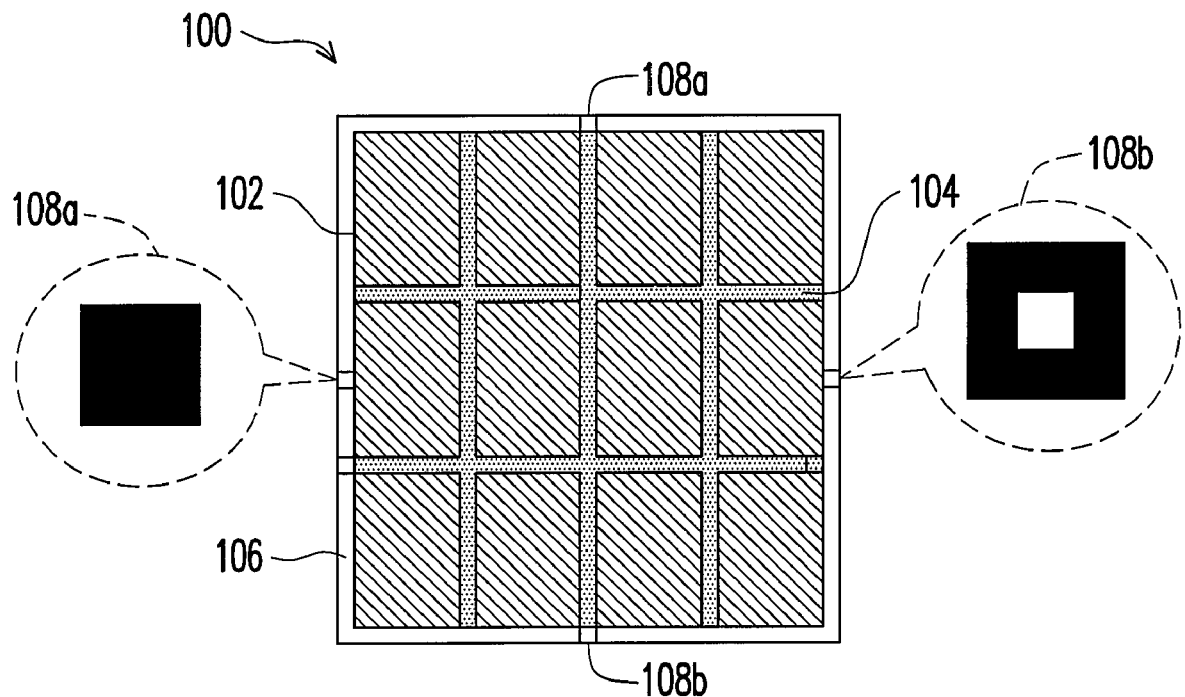
FIG. 1 is planar view showing a conventional photomask with alignment marks for the current layer.
Figure 2:
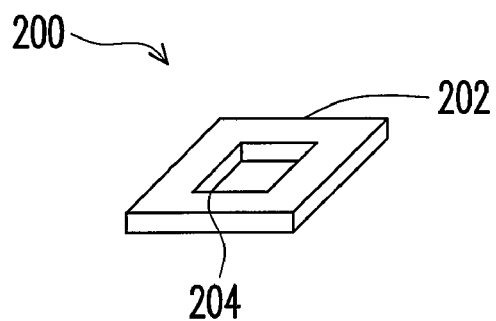
FIG. 2 is a perspective view of photo resist pattern by using conventional photomask in FIG. 1 to process the exposure and development.

As shown in FIG. 3, the photomask in the present embodiment comprises four edges and further includes a plurality of main patterns 302, one inter-scribe lane pattern 304, one extra-scribe lane pattern 306, a first set of alignment marks for the current layer I, I' and a second set of alignment marks for the current layer II, II'. The inter-scribe lane pattern 304 is sited between the main patterns 302. Then the extra-scribe lane pattern 306 is merely sited on the tree edges of the photomask 300; namely, ⊓ shape extra-scribe lane pattern, in order to improve the mask area use efficiency. The first set of alignment marks for the current layer I, I' are sited on the opposite edges having the extra-scribe lane pattern 306. Further, the first set of alignment marks for the current layer I, I' can adopt the conventional alignment mark, such as the alignment mark for the current layer is constituted by a block and a frame as shown in FIG. 1. The second set of alignment marks for the current layer II, II' are sited on opposite edges in which only one has the extra-scribe lane pattern, and they are placed on opposite locations in the inter-scribe lane pattern and the extra-scribe lane pattern, respectively. Please refer to the following figures and description for detail pattern of the second set alignment marks for the current layer II, II'.

Figures 4A, 4B:
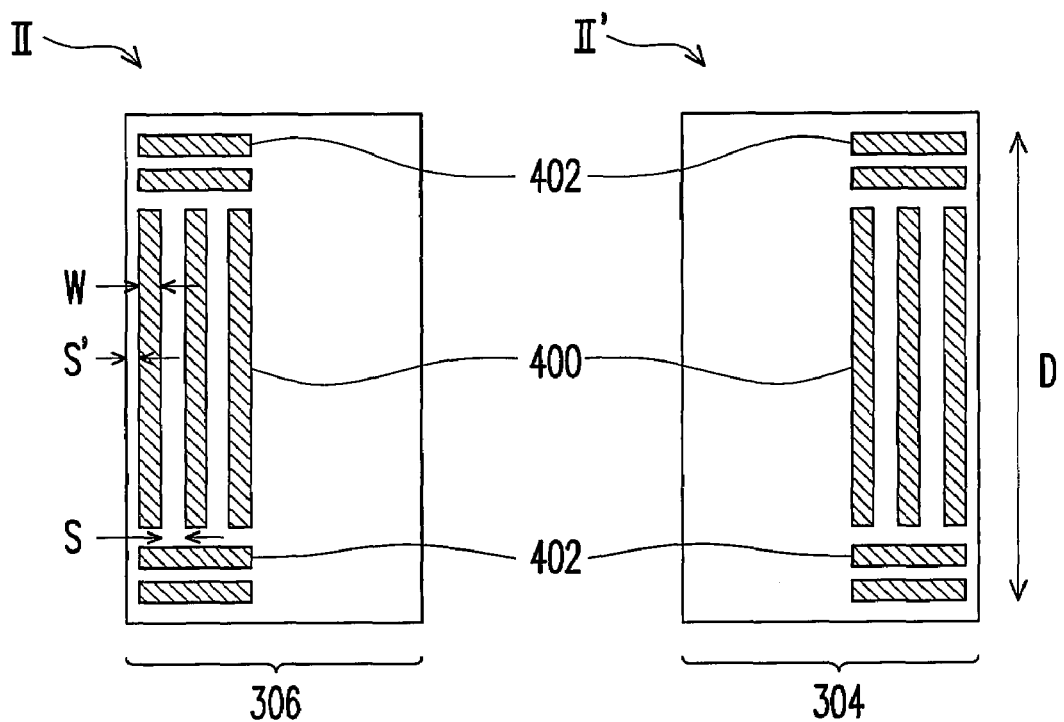
FIGS. 4A and 4B are the planar view of the second alignment marks for the current layer of the photomask shown in FIG. 3.

FIGS. 4A and 4B are the planar view of the second alignment marks for the current layer II, II' of the photomask shown in FIG. 3.

Referring to FIGS. 4A and 4B, each one of the second set of alignment marks for the current layer II, II' includes a plurality of parallel patterns 400 and at least one vertical pattern 402 sited on at least one end of the parallel patterns 400 which are parallel to an extended direction D of the opposite edges. As shown in the figure, the vertical pattern 402 can also be sited on two ends of the parallel pattern 400. Further, the number of the vertical pattern 402 and parallel pattern 400 can be adjusted as required. Moreover, the second set of the alignment marks for the current layer II, II' such as mirror symmetrical are sited on the opposite edges of the outside of the inter-scribe lane pattern 304 and the outside of the extra-scribe lane pattern 306, respectively. Each of the aforementioned parallel patterns 400 is preferably provided with the identical size for better observation and measurement. In the example shown in FIG. 4A, every parallel pattern 400 of each one of the second set alignment marks for the current layer II, II' is provided with a width W which can be set to equal to the distance S between the parallel patterns 400. Furthermore, half of the width W can be set to equal to the shortest distance S' between the parallel patterns 400 and the edge of the photomask (refer to 300 marked in FIG. 3). Therefore, after the stepping exposure and development, it is known whether the shot map in each step is correct from the sets of the alignment marks in FIGS. 4A and 4B.

Figure 5A:
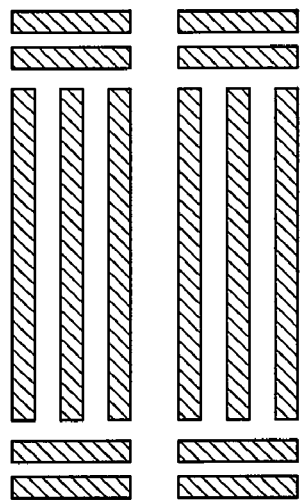
FIGS. 5A to 5D are diagrams showing the result of the second set of the alignment marks for the current layer after the exposure and development by using the photomask shown in FIG. 3.
Figure 5B:
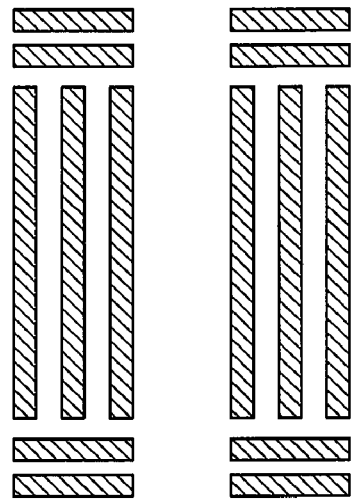
Figure 5C:
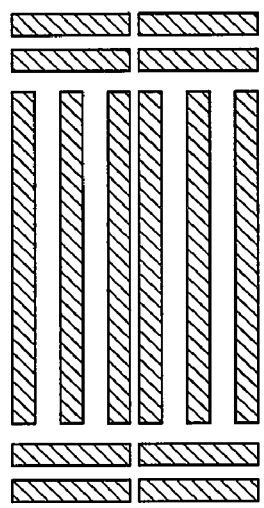
Figure 5D:
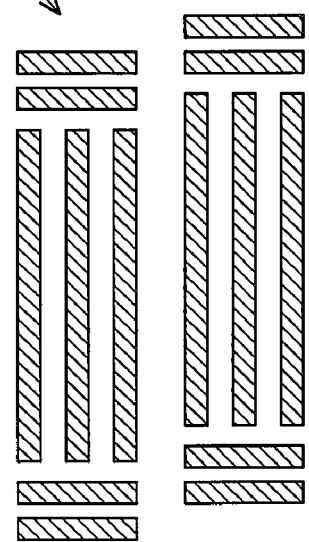

FIGS. 5A to 5D are diagrams showing the result of the second set of the alignment marks for the current layer after the exposure and development by using the photomask shown in FIG. 3. FIG. 5A is a pattern showing qualified of the exposure shot map accuracy of the second set of the alignment marks II, II' after the stepping exposure and development. FIGS. 5B and 5C show the variation in the parallel direction between the two steps exposures. Meanwhile, 5D is the result caused by the variation in the vertical direction between the two steps exposures.

Figure 6:
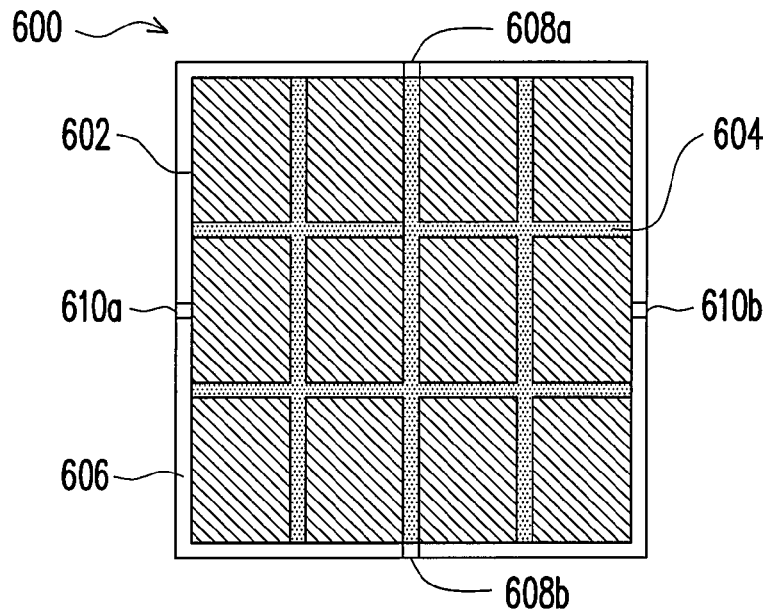
FIG. 6 is a planar view of a photomask according to another embodiment of the present invention.

FIG. 6 is a planar view of the photomask according to another embodiment of the present invention.

Referring to FIG. 6, the photomask 600 in this embodiment is provided with four edges and includes a plurality of main patterns 602, an inter-scribe lane pattern 604 sited between the main patterns 602, an extra-scribe lane pattern 606 sited on the four edges of the photomask 600, two sets of the alignment marks for the current layer 608a, 608b and 610a, 610b sited on the opposite edges of the extra-scribe lane pattern 606. Furthermore, at least one set of the alignment marks for the current layer adopt the pattern shown in FIGS. 7A and 7B.

Figure 7A:
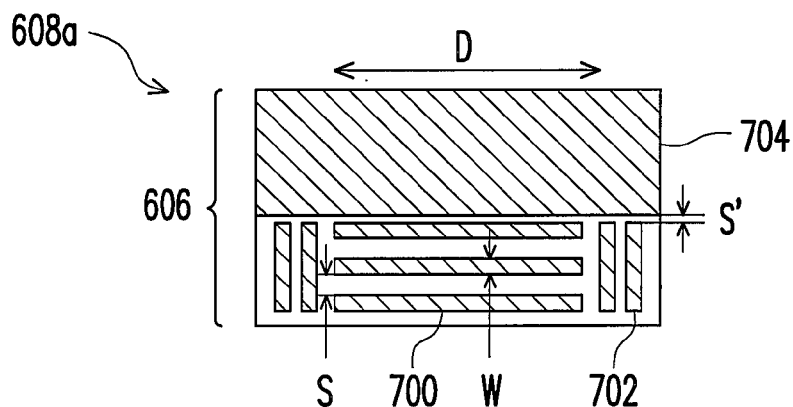
FIGS. 7A and 7B are the planar views of one set of the alignment marks for the current layer 608a, 608b of the photomask shown in FIG. 6.
Figure 7B:
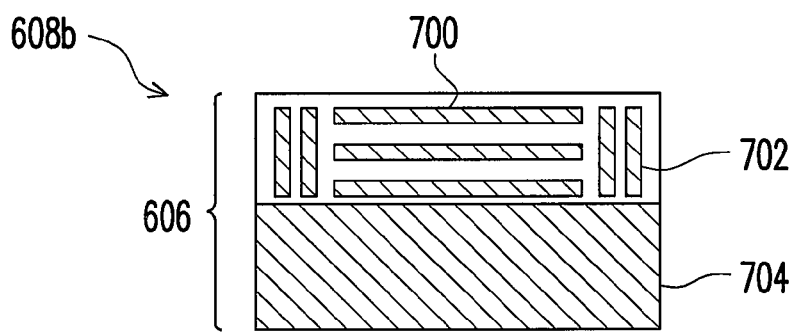

Referring to FIGS. 7A and 7B simultaneously, which are the planar views of one set of the alignment marks for the current layer 608a, 608b of the photomask shown in FIG. 6. It is shown in the figure that each of the alignment mark comprises a plurality of parallel patterns 700 parallel in the extended direction D on the opposite edges, at least one vertical pattern 702 sited on at least end of the aforementioned parallel patterns 700 and a cover pattern 704. The relationship between the aforementioned parallel pattern 700 and the vertical patterns 702 is similar to that of the previous embodiment, such as the vertical patterns 702 can be sited on the two ends of the parallel patterns 700. However, the cover pattern 704 is sited beyond the area of parallel patterns 700 and the vertical patterns 702 to prevent the exposure source from re-exposing the neighbor shot map resulting in undesired interference to the alignment mark for the current layer. For example, FIGS. 7A and 7B are shown to set the cover pattern 704 covering a outside area of the extra-scribe lane pattern 606 as well as a inside area of the extra-scribe lane pattern 606, respectively. Furthermore, another set of the alignment marks for the current layer 610a and 610b of the photomask shown in FIG. 6 can also adopt the alignment marks for the current layer shown in FIGS. 7A and 7B. Meanwhile, each of the parallel patterns 700 is preferably provided with identical size to have better observation and measure.

Referring to FIG. 7A, a width W from each parallel pattern 700 of the alignment mark for the current layer 608a is provided, it can be set to equal to the distance S between the parallel patterns 700. Furthermore, half of the width W equals to the shortest distance S' between the parallel patterns 700 and the cover pattern 704.

In addition, the sets of alignment marks for the current layer shown in FIGS. 7A and 7B are applicable to the first set of the alignment marks for the current layer I, I' (refer to FIG. 3) in the previous embodiment.

In summary, the characteristic of the present invention is to use the photomask with "⊓ shape extra-scribe lane pattern" to improve the mask area use efficiency, and to switch the alignment marks for the current layer used to be sited on the non extra-scribed lane pattern to the inter-scribed lane pattern in order to control whether the exposure shot map accuracy is qualified in the exposure steps. Moreover, the alignment marks for the current layer of this present invention are simultaneously provided with the parallel pattern and vertical pattern and can be applicable to be used in general mask as well as simultaneously determine the variation of the parallel and vertical movement.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photomask with alignment marks for the current layer having four edges, wherein the photomask comprising:
   a plurality of main patterns;
   an inter-scribed lane pattern sited between the plurality of main patterns;
   an extra-scribed lane pattern sited merely on three edges of the photomask to improve the mask area use efficiency;
   a first set of the alignment marks for the current layer sited on opposite edges of the extra-scribed lane pattern; and
   a second set of alignment marks for the current layer sited on opposite edges in which only one has the extra-scribe lane pattern and placed on opposite locations in the inter-scribe lane pattern and the extra-scribe lane pattern, respectively, wherein each alignment mark of the second set of alignment marks for the current layer comprising:
   a plurality of parallel patterns parallel to an extended direction of the opposite edges; and
   at least one vertical pattern sited on at least one end of the plurality of parallel patterns.

2. The photomask with alignment marks for the current layer of claim 1, wherein the second set of alignment marks for the current layer are mirror symmetrical.

3. The photomask with alignment marks for the current layer of claim 1, wherein a width which is equal to the distance between the plurality of parallel patterns is provided by each of the plurality of parallel pattern of the second sets of alignment marks for the current layer.

4. The photomask with alignment marks for the current layer of claim 1, wherein the second sets of the alignment marks for the current layer are sited on the outside of the inter-scribed lane pattern and the outside of the extra-scribed lane pattern at the opposite edges, respectively.

5. The photomask with alignment marks for the current layer of claim 4, wherein a width is provided by each of the plurality of parallel patterns of the second set alignment marks for the current layer, and
   the width equals to the distance between the plurality of parallel patterns; and
   half of the width equals to the shortest distance between the plurality of parallel patterns and the edge of the photomask.

6. The photomask with alignment marks for the current layer of claim 1, wherein the vertical pattern comprising being sited on the two ends of the plurality of the parallel patterns.

7. The photomask with alignment marks for the current layer of claim 1, wherein each of the plurality of parallel patterns is provided with identical size.

* * * * *